United States Patent [19]
Arques et al.

[11] Patent Number: 5,777,495
[45] Date of Patent: Jul. 7, 1998

[54] METHOD FOR THE HIGH-LINEARITY COPYING OF VOLTAGE

[75] Inventors: Marc Arques, Grenoble; Thierry Ducourant, Voiron, both of France

[73] Assignee: Thomson Tubes Electroniques, Meudon La Foret, France

[21] Appl. No.: 606,842

[22] Filed: Feb. 26, 1996

[30] Foreign Application Priority Data

Mar. 7, 1995 [FR] France ................... 95 02632

[51] Int. Cl.⁶ .................................................. H03K 17/00
[52] U.S. Cl. ..................... 327/94; 327/390; 327/589; 327/537; 327/434
[58] Field of Search ...................... 327/91, 94, 390, 327/536, 537, 589, 434, 436; 326/61; 377/57, 63

[56] References Cited

U.S. PATENT DOCUMENTS

| | | |
|---|---|---|
| 3,900,743 | 8/1975 | Weimer. |
| 3,986,176 | 10/1976 | Weimer. |
| 4,070,667 | 1/1978 | Eichelberger ............... 377/57 |
| 4,082,963 | 4/1978 | Hoffmann ................... 377/57 |
| 4,138,666 | 2/1979 | Eichelberger et al. . |
| 4,247,919 | 1/1981 | White, Jr. et al. . |
| 4,554,571 | 11/1985 | Arques . |
| 4,587,426 | 5/1986 | Munier et al. . |
| 4,590,390 | 5/1986 | Arques . |
| 4,598,320 | 7/1986 | Arques . |
| 4,609,824 | 9/1986 | Munier et al. . |
| 4,647,955 | 3/1987 | Portman et al. . |
| 4,649,289 | 3/1987 | Nakano ..................... 327/543 |
| 4,685,117 | 8/1987 | Arques . |
| 4,743,751 | 5/1988 | Arques et al. . |
| 4,758,741 | 7/1988 | Arques . |
| 4,768,211 | 8/1988 | Arques . |
| 4,797,546 | 1/1989 | Berger et al. . |
| 4,797,560 | 1/1989 | Berger et al. . |
| 4,810,881 | 3/1989 | Berger et al. . |
| 4,827,145 | 5/1989 | Arques . |
| 4,906,855 | 3/1990 | Berger et al. . |
| 4,916,664 | 4/1990 | Berger et al. . |
| 4,940,901 | 7/1990 | Henry et al. . |
| 4,945,242 | 7/1990 | Berger et al. . |
| 4,945,243 | 7/1990 | Arques . |
| 4,945,420 | 7/1990 | Berger et al. . |
| 4,948,966 | 8/1990 | Arques et al. . |
| 4,952,788 | 8/1990 | Berger et al. . |
| 4,957,659 | 9/1990 | Arques . |
| 5,003,167 | 3/1991 | Arques . |
| 5,048,016 | 9/1991 | Schwendt ................... 327/590 |
| 5,117,177 | 5/1992 | Eaton, Jr. ................... 323/314 |
| 5,164,621 | 11/1992 | Miyamoto ................... 327/262 |
| 5,225,706 | 7/1993 | Berger et al. . |
| 5,369,281 | 11/1994 | Spinnler et al. . |

FOREIGN PATENT DOCUMENTS 43 25 362 A1  2/1994  Germany .

*Primary Examiner*—Terry Cunningham
*Attorney, Agent, or Firm*—Oblon, Spivak, McClelland, Maier & Neustadt, P.C.

[57] ABSTRACT

A device for copying a voltage (Ve) comprises a pair of series-connected MOS transistors, their sources forming a common point. The voltage (Ve) to be copied is applied between the gate of the first MOS transistor of the pair and a reference. Means are provided to inject a flux of electrons at a common point. A storage capacitor has a first terminal connected to the drain of the second MOS transistor and a second terminal designed to be biased. Means dictate a potential at the drain of the second MOS transistor and then let it vary so that the flux of electrons is stored in the storage capacitor while at the same time decreasing in the second MOS transistor to the benefit of the first one. The copied voltage Vs is available, after stabilization, between the first terminal of the storage capacitor and the reference. Application in particular to circuits for the reading of charges generated in a photosensitive matrix or photosensitive linear array.

20 Claims, 7 Drawing Sheets

METHOD FOR THE HIGH-LINEARITY COPYING OF VOLTAGE

BACKGROUND OF THE INVENTION

1. Field of the Invention

The present invention relates to a MOS transistor device for the copying of voltage that can be used especially in a charge-coupled device and more particularly in a device for the reading of charges generated in a photosensitive matrix or photosensitive linear array.

2. Description of the Prior Art

MOS transistor devices of a known type for copying voltages use two series-mounted MOS transistors. One transistor is mounted as a follower and the other as a load. The drain of the load transistor is connected to the source of the follower transistor. The input voltage to be copied is applied between the gate of the follower transistor and a reference and the output voltage copied is taken between, on the one hand, the common point between the two MOS transistors and, on the other hand, the reference. The input voltage to be copied is generally available at high impedance which may even become infinite. It is sought to make the copied voltage as close as possible to the voltage to be copied. It may be usable at low impedance or else at infinite impedance. A fixed difference may be accepted between the copied voltage and the voltage to be copied.

A copied voltage is obtained equal to the voltage to be copied minus an independent term of the voltage to be copied and the threshold voltage of the MOS transistor mounted as a follower. Broadly speaking, this threshold voltage may be considered to be a constant; However, in more precise terms, it is a function of the voltage applied to the gate of the transistor mounted as a follower and hence of the voltage to be copied. The difference between the copied voltage and the voltage to be copied is no longer fixed and the. circuit is not linear.

In practice, for a variation of about one volt in the voltage to be copied, the non-linearity may reach a few percentile points.

The present invention seeks to overcome these problems of non-linearity between the copied voltage and the voltage to be copied.

It proposes a voltage copying device that transmits the variation of the voltage to be copied as faithfully as possible throughout the range of use.

SUMMARY OF THE INVENTION

For this purpose, the voltage copying device according to the invention comprises: a pair of MOS transistors having a common point at their sources, means to inject a flux of electrons at the common point, a storage capacitor having a first terminal connected to the drain of the second MOS transistor and having a second terminal designed to be biased, means to dictate a potential at the drain of the second MOS transistor of the pair and then to let it vary so that the flux injected into the common point is stored in the storage capacitor while at the same time decreasing in the second MOS transistor to the benefit of the first one. The voltage to be copied is applied between the gate of the first MOS transistor and a reference, the copied voltage being available, after stabilization, between the first terminal of the storage capacitor and the reference.

The means for injecting the flux of electrons will be preferably formed by a MOS transistor.

The means for dictating the potential will be preferably formed by a switch, one end of which is connected to the first terminal of the storage capacitance while the other end is designed to be biased.

To accelerate the copying time, provision may be made for means to regulate the injection of electrons at the common point, as a function of the flux of electrons flowing in the first MOS transistor of the pair. It is possible to add means for the processing of the copied voltage so as to be able to have this voltage available with a lower impedance than the impedance that it has when it has been tapped at the storage capacitor.

It may be advantageous to provide for means to preserve a same value of the copied voltage when the copied voltage changes value.

BRIEF DESCRIPTION OF THE DRAWINGS

Other features and advantages of the present invention will appear from the following description of various embodiments given with reference to the appended drawings, of which.

MORE DETAILED DESCRIPTION

In the figures, the same references designate the same elements. For clarity's sake, they have not been drawn in keeping with the dimensions and proportions of the elements.

FIG. 1a shows a known type of MOS transistor voltage copying device. This device has two series mounted MOS transistors T1', T2', the two transistors having a common point between the drain d2' of the transistor T2' and the source s1' of the transistor T1'. These transistors are designed to be supplied with power: the source s2' of the transistor T2' is taken to the potential VSS and the drain d1' of the transistor T1' to the potential VDD. The potential VSS is lower than the potential VDD.

The transistor T1' is called a follower. Between its gate g1' and a reference, it receives the voltage to be copied Ve. The transistor T2' is called a load, its gate g2' is connected to its source s2'. The voltage copy Vs is taken between the midpoint of the two MOS transistors T1', T2' and the reference.

Figure 1:
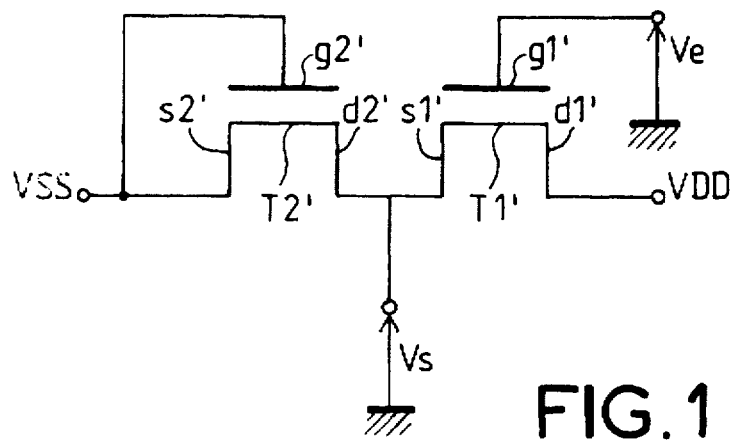
- FIG. 1 shows a diagram of a known voltage copying device.

In the drawing of FIG. 1, it is assumed that the MOS transistor T2' has a channel implantation such that its threshold voltage VT2 is negative.

Its channel potential $\Phi2$ is defined by the following relationship:

$$\Phi2 = VG2 - VT2$$

with VG2 as its gate voltage.

Its current I2' is given by the relationship: t.60

$$I2' = \frac{1}{2} \mu Cox_2 \left( \frac{W2}{L2} \right)(\phi2 - VSS)^2$$

$$\text{or } I2' = \frac{1}{2} \mu Cox_2 \frac{W2}{L2} VT2^2$$

with:

$\mu$ mobility of the electrons in the channel $Cox_2$ surface capacity of the gate insulator of the MOS transistor T2'

W2 width of the MOS transistor T2'

L2 length of the MOS T2'.

A current I1' equal to I2' flows in the MOS transistor T1'.

$$I1' = \frac{1}{2} \mu Cox_1 \frac{W1}{L1} (\phi1 - VS1)^2.$$

with:

$Cox_1$ surface capacity of the gate insulator of the MOS transistor T1'

W1 width of the MOS transistor T1'

L1 length of the MOS T1'.

$\Phi1$ channel potential of the MOS transistor T1' with $\Phi=VG1-VT1$, VG1 being its gate voltage, VT1 its threshold voltage VS1 source voltage of the MOS transistor T1'.

$$I1' = \frac{1}{2} \mu Cox_1 \frac{W1}{L1} (VG1 - VT1 - VS1)^2$$

$$I1' = \frac{1}{2} \mu Cox_1 \frac{W1}{L1} (Ve - VT1 - Vs)^2$$

Since $I1' = I2'$ $$(Ve - VT1 - Vs)^2 = \frac{\frac{1}{2} \mu Cox_2 \frac{W2}{L2}}{\frac{1}{2} \mu Cox_1 \frac{W1}{L1}} \cdot VT2^2$$

The term $$\frac{\frac{1}{2} \mu Cox_2 \frac{W2}{L2}}{\frac{1}{2} \mu Cox_1 \frac{W1}{L1}} \cdot VT2^2$$

is independent of Ve and of Vs. It is constant. Let it be assumed that it is equal to $K^2$. Vs=Ve−K−VT1 is deduced.

Broadly speaking, VT1 is a constant but expressed in more precise terms, VT1 is a function of Ve. The circuit of FIG. 1 introduces a non-linearity between Vs and Ve.

Figure 2:
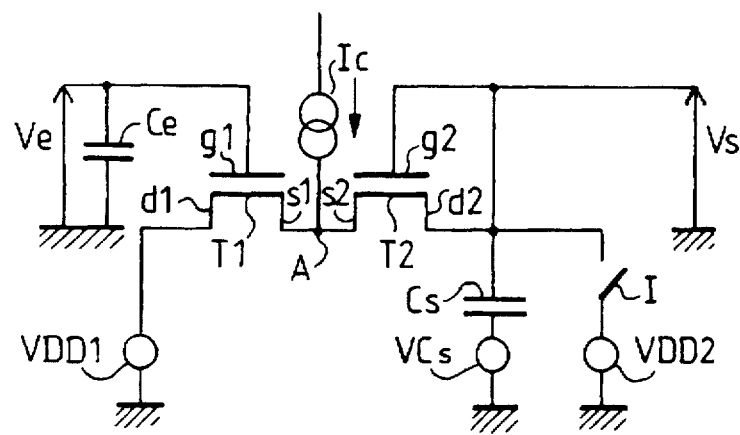
FIG. 2 shows a diagram of an examplary voltage copying device according to the invention.

FIG. 2 exemplifies a voltage copying device according to the invention.

This device has a pair of MOS transistors T1, T2 with their sources s1 and s2 connected to a common point A. The voltage to be copied Ve is applied between the gate g1 of the first MOS transistor T1 and a reference. The gate g2 and the drain d2 of the second MOS transistor T2 are connected. The drain d2 of the second MOS transistor T2 is also connected to a first terminal of a storage capacitor Cs. The second terminal of the storage capacitor Cs is designed to be biased by a voltage VCs. Means Ic are designed to inject a flux of electrons at the common point A.

Means I are designed in order, in a first stage, to dictate the potential Vd2 of the drain d2 of the second MOS transistor T2, and then, in a second stage, to let it vary. The copied voltage Vs is taken before the first terminal of the storage capacitor Cs and the reference.

The drain d1 of the first MOS transistor T1 is designed to receive a bias voltage VDD1.

The means I for dictating the potential and then letting it vary may be formed by a switch I having a first terminal connected to the drain d2 of the second MOS transistor T2 of the pair and a second terminal designed to receive a bias voltage VDD2 dictating the potential Vd2. In practice, the switch I could be formed by a MOS transistor for example. The bias voltages VDD1 and VDD2 are higher than the channel potential generated by Ve in the MOS transistor T1 and the voltage present at the common point A.

The voltages VDD2, VDD1 and VCs may be given by three distinct power sources but in practice it is preferable to use fewer of them. A single power source may suffice to give the three bias voltages.

The means Ic for the injection of the flux of electrons into the common point A may be formed, for example, by a MOS transistor such as is described in FIG. 9a here below.

FIGS. 3a, 3b, 3c, 3d show the progress of the channel potentials in the substrate into which the device according to the invention is integrated.

Figure 3A:
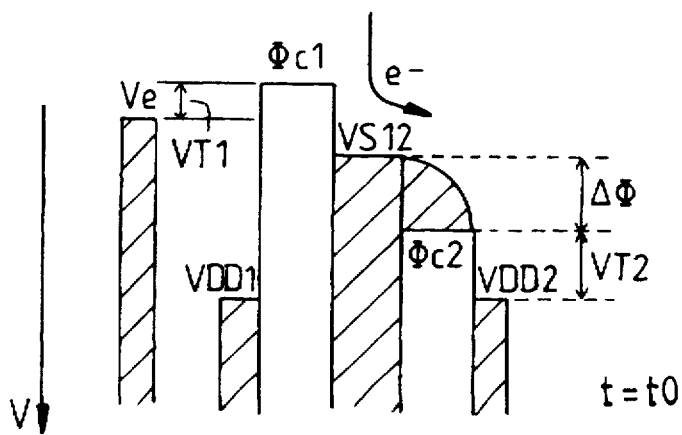
FIGS. 3a, 3b, 3c, 3d show the progress of channel potentials in the substrate, into which the device of FIG. 2 is integrated, at four successive instants.

FIG. 3a localizes the instant t0. At this instant, the switch I is on. The potential Vd2 of the drain d2 of the MOS transistor T2 is laid down and is equal to VDD2. The electrons injected into the common point A go through the MOS transistor T2.

The channel potential $\Phi c1$ of the MOS transistor T1 is defined by:

$$\Phi c1 = Ve - VT1.$$

VT1 is the threshold voltage of the MOS transistor T1.

Figure 3B:
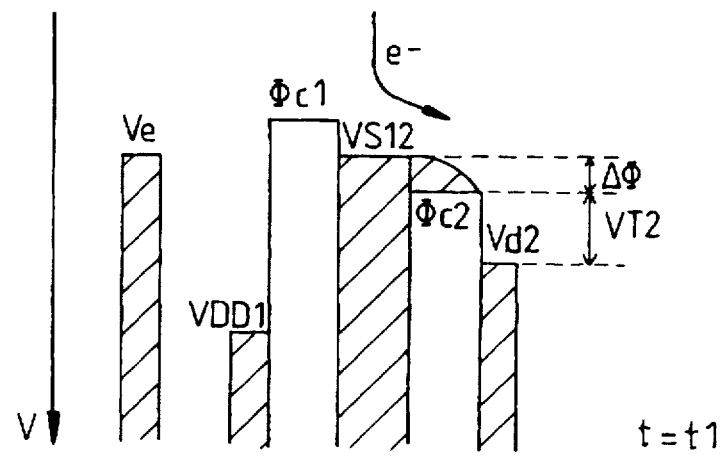

FIG. 3b is located at the point in time t1. At this point in time, the switch I is off. The potential Vd2 may vary. The storage capacitor Cs gets charged by means of the flux of electrons going through the MOS transistor T2. The potential Vd2 diminishes.

Figure 3C:
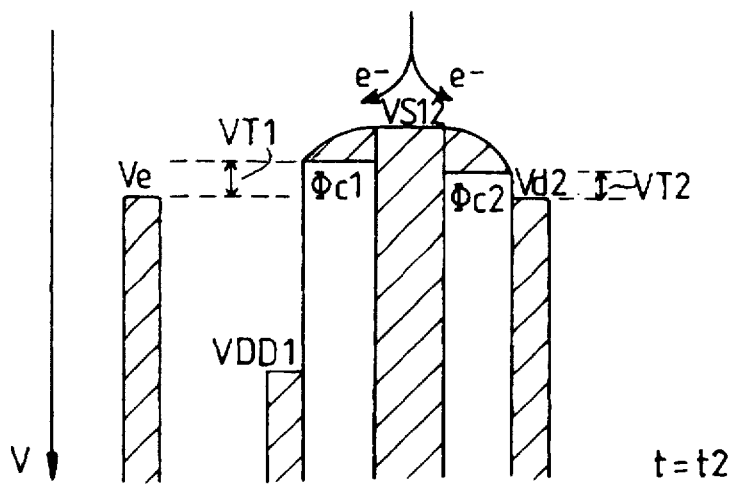

FIG. 3c is located at the point in time t2. At this instant, the flux of electrons injected into the common point A is distributed between the two MOS transistors T1 and T2. The potential Vd2 continues to decrease and fewer and fewer electrons go through the MOS transistor T2.

Figure 3D:
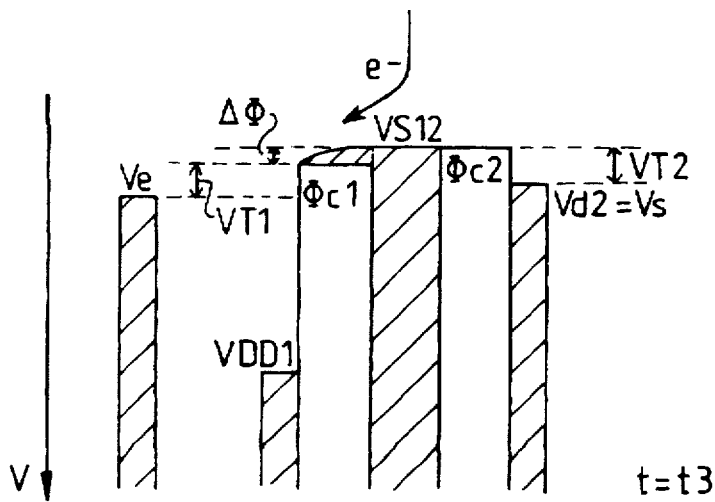

FIG. 3d is located at the point in time t3 which is the final point in time. The entire flux of electrons injected into the common point A goes through the MOS transistor T1 and the MOS transistor T2 is off. The copied voltage Vs is available between the first terminal of the storage capacitor Cs and the reference. It corresponds to the potential Vd2 of the drain d2 of the MOS transistor T2 if the reference is the ground.

$$Vs = Ve - VT1 - \Delta\Phi + VT2$$

$$\Delta\Phi = \Phi c2 - VS12 \text{ with:}$$

VS12 the potential of the common point A. The voltage $\Delta\Phi$ depends on the source Ic that injects the electrons. It practically does not depend on Ve. It may be made negligible if the two MOS transistors T1, T2 are chosen such that their width to length ratio is great.

The two MOS transistors T1, T2 are chosen to be as similar as possible. They are close to each other, they are either not implanted (natural type) or implanted with a P type impurity. In this case, their respective threshold voltages VT1 and VT2 are positive.

At the point in time t3, the difference between the channel potentials of the two MOS transistors is equal to $\Delta\Phi$. If $\Delta\Phi$ is small, it may be assumed that their threshold voltages VT2, VT1 are substantially equal, whatever may be the voltage to be copied Ve. The result thereof is that the voltage copied Vs is substantially equal to the voltage to be copied Ve.

The relationship between Vs and Ve is independent of the value of the storage capacitor Cs. If it is desired to obtain the voltage Vs at high impedance, all that needs to be done is to choose Cs to be great. In the devices for the reading of charges generated in a photosensitive matrix or photosensitive linear array, the input voltage Ve to be copied is defined by a quantity of charges Qe stored in a capacitor Ce. It is possible to choose the value of the storage capacitor Cs for the copied voltage Vs such that is greater than the value of the storage capacitor Ce for the voltage to be copied Ve.

With the device of FIG. 2, the copied voltage Vs is not obtained instantaneously. This is because the time during which the flux of electrons is shared between the two 140S transistors T1, T2 is not negligible. In fact, a lengthy period of time elapses before there is no longer any electron flowing into the MOS transistor T2. Just after the switch I is turned off, the potential Vd2 decreases very swiftly but then it decreases far more slowly.

In practice, there will be a wait of several microseconds after the switch I is turned off before it is assumed that the flux of electrons in the MOS transistor T2 has stopped and that the voltage copied Vs is available. This period of time may be excessively long in certain applications. For example, in a photosensitive matrix of 1000 lines working at 30Hz, where the time taken to read one line of this matrix is 30 µs, waiting for 3 µs in order to have the copied voltage available is just tolerable. Ten percent of the time is lost.

By contrast, if the matrix has 2000 lines or more, a time of 3 µs is too long.

Figure 4:
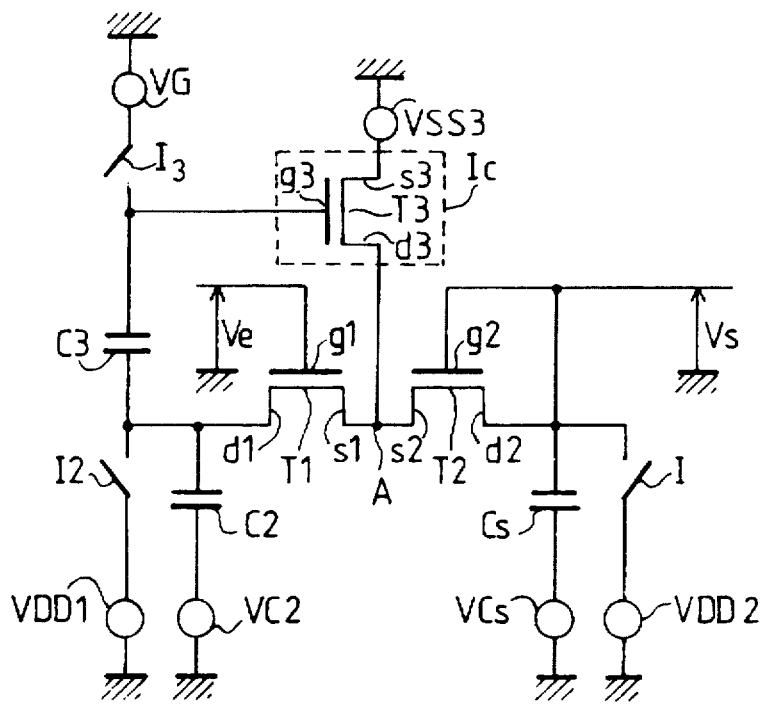
FIG. 4 shows a diagram of an examplary voltage copying device according to the invention that is speedier than the device of FIG. 2.

The diagram of FIG. 4 shows a variant of the diagram of FIG. 2. The time needed for the copying has been reduced.

This variant provides for means to regulate the flux of electrons injected into the common point A in order that it will diminish when the flux of electrons going through the first MOS transistor T1 of the pair increases.

These means comprise first additional means I2 which, initially, dictate a potential V d1 at the drain d1 of the first MOS transistor T1. In a second stage, these first additional means I2 allow it to vary so that the flux of electrons flowing in the first MOS transistor T1 gets stored at a second storage capacitor C2 whose first terminal is connected to the drain d1 of the first MOS transistor Ti and whose second terminal is designed to be biased by a voltage VC2. These first additional means comprise a first additional transistor I2 having one end connected to the drain d1 of the first MOS transistor T1 and having its other end designed to receive a bias voltage VDD1 dictating the potential Vd1.

These means also comprise second additional means I3, C3 for the initializing, in an initial stage, of the injection of electrons into the common point A and then for the diminishing of this injection as a function of the diminishing of the potential Vd1 at the drain of the first MOS transistor T1. When the means Ic for injecting the flux of electrons at the common point A are formed by a MOS transistor T3, the drain d3 of which is connected to the common point A, the second additional means I3, C3 initially dictate a potential Vg at the gate g3 of the MOS transistor T3 to initialize the injection of electrons and then, in a second stage, they transmit the variation of the potential of the drain d1 of the MOS transistor T1 to this gate g3. These second additional means comprise a third switch I3 and a third capacitor C3. The third switch I3 has one end connected to the gate g3 of the MOS transistor T3 and the other end designed to receive a bias voltage VG dictating the potential Vg. The third capacitor C3 is mounted between the drain d1 of the MOS transistor T1 and the gate g3 of the MOS transistor T3. It is used to transmit the variation in potential of the drain d1. The source s3 of the MOS transistor T3 is designed to be biased by a voltage VSS3.

These means to regulate the flux of electrons injected into the common point A enable the diminishing of the time needed to copy it. The time needed to copy it depends on the value of the storage capacitor C2. The smaller it is, the shorter is the time.

The bias voltages VG and VSS3 are chosen so that the MOS transistor T3 is in saturated mode when the third switch I3 is on. In this configuration: VG−VT3−VSS3>0.

A simple approach lies in choosing VG and VSS3 so that they are identical and equal to zero and in taking a third MOS transistor T3 with a negative threshold voltage VT3, namely a MOS transistor with a buried channel. Other choices for VSS3, VG and VT3 are of course possible.

It is possible to give the bias voltages VDD1, VDD2, VC2, VCs on the basis of a single voltage source and to use several sources.

The working of such a circuit is as follows:

At the point in time t0, the switches I, I2, I3 are all on. The potentials at the terminals of the electrodes of the capacitors Cs, C2, C3 are fixed. The potentials Vd1, Vd2, Vd3 are dictated. The MOS transistor T3 works as a current source and the flux of electrons that it delivers to the common point A goes through the MOS transistor T2.

At the instant t1, all the switches I, I2, I3 are off. This deactivation may be synchronized for all the three switches I, I2, I3 by means of, for example, only one pulsed supply. The potentials Vd1, Vd2, Vg may vary. However it may be judicious to turn the switches I2 and I3 off one after the other so as not to disturb the third capacitor C3. The switch I may be turned off at the same time as the switch I2 or at the same time as the switch I3.

The flux of electrons delivered by the MOS transistor T3 goes through the MOS transistor T2 and gets integrated into the capacitor Cs in reducing the drain voltage Vd2 of the MOS transistor T2 as in the example of FIG. 2.

At the instant t2, the flux of electrons delivered by the MOS transistor T3 starts being distributed between the two MOS transistors T1, T2. The electrons flowing through the MOS transistor T1 get integrated into the second storage capacitor C2 and the drain potential Vd1 of the MOS transistor Ti decreases. This drop in potential is transmitted by the third capacitor C3 to the gate g3 of the MOS transistor T3. This drop in potential at the gate g3 causes a reduction in the quantity of electrons given to the common point A. The MOS transistor T3 finally goes off and the copied voltage Vs gets stabilized. This stabilizing occurs at greater speed than in the example of FIG. 2.

The maximum value of Vs is:

Vs max=Ve−VT1+$\Delta\Phi$+VT2 if the value of the capacitor C2 is small, namely if the voltage Vs is available as soon as the electrons start flowing through the MOS transistor T1.

The minimum value of Vs is:

Vs min=Ve−VT1−$\Delta\Phi$+VT2 if the value of the capacitor C2 is great. For mean values of C2, the value of Vs will range between the two values which are the maximum and minimum values.

In any case, for a given value of the capacitor C2, the value of Vs and the time needed to obtain it will be stable and reproducible from one use to another.

As compared with the circuit of FIG. 2, the circuit of FIG. 4 slightly accelerates the time needed to obtain the copied voltage Vs. However, since the progress of the potential Vd1 of the drain of the MOS transistor T1 slows down when the flux of electrons injected at the common point A decreases and since it is the potential Vd1 that seeks to control the flux of electrons injected at the common point A, the MOS transistor T3 may take a certain amount of time to go off.

Figure 5:
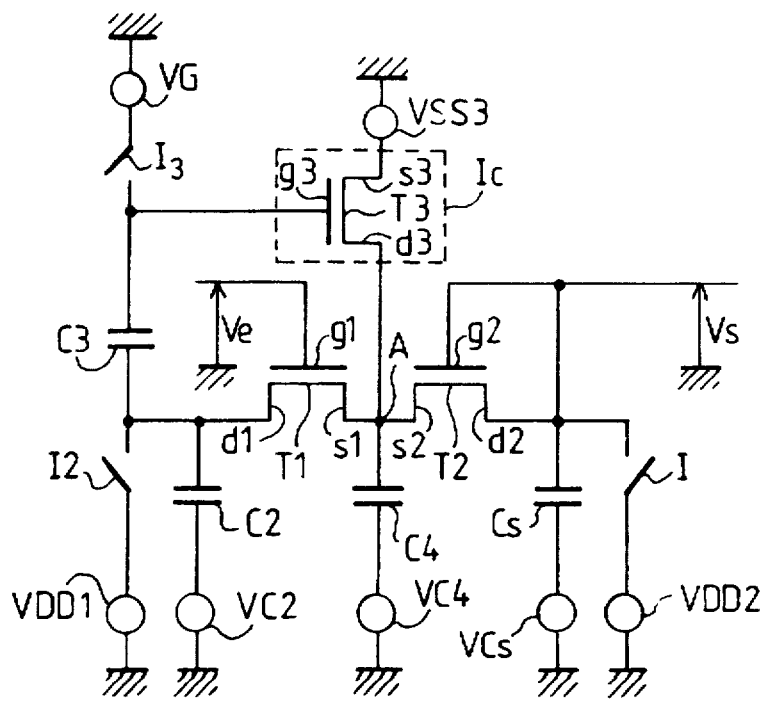
FIG. 5 shows a diagram of a variant of the example of FIG. 4.

FIG. 5 exemplifies a variant of a voltage copying device according to the invention that is even faster.

A buffer capacitor C4 has been added to the elements shown in the drawing of FIG. 4. This buffer capacitor C4 has one terminal connected to the common point A and the other terminal designed to be biased by a voltage VC4. This voltage VC4 may be given by the single voltage source which gives VDD2, VDD1, VCs, VC2 or by another voltage source.

In this variant, when the flux of electrons injected at the common point A by the MOS transistor T3 diminishes, the flows that get distributed in the MOS transistors T1 and T2 do not diminish instantaneously for the buffer capacitor C4 keeps the potential VS12 of the point common A substantially constant.

The flux of electrons going through the MOS transistor T1 continues to get integrated into the capacitor C2 and the MOS transistor T3 goes off more quickly.

Figure 6:
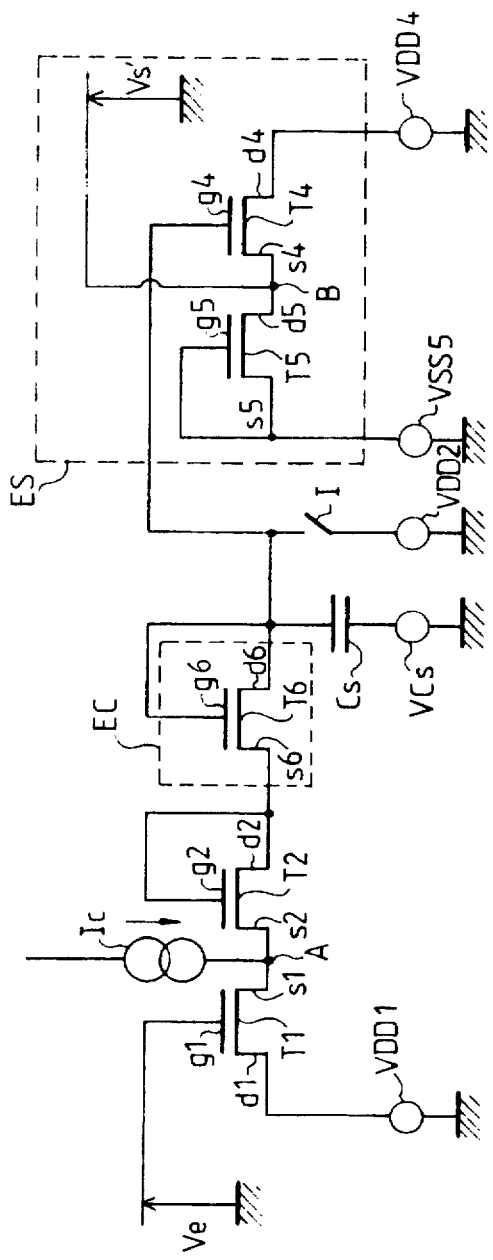
FIG. 6 shows a diagram of an examplary device according to the invention giving the copied voltage at low impedance.

In all the examples described here above, the copied voltage Vs is available at high impedance for it is given by a quantity of charges stored at the storage capacitor Cs. In certain applications, it may be useful to have available a copied voltage that is no longer at high impedance but at lower impedance. This is what is shown in FIG. 6 which gives another example of the voltage copying device according to the invention.

Means to process the copied voltage, enabling it to be given with lower impedance, have been added to the elements in the drawing of FIG. 2.

These processing means comprise a follower stage ES connected to the first terminal of the storage capacitor Cs and a compensation stage EC. The follower stage ES gives the copied voltage Vs' at low impedance and the compensation stage EC compensates for an inevitable voltage difference introduced by the follower stage ES. The compensation stage EC is connected between the first terminal of the storage capacitor Cs and a pair of MOS transistors T1, T2.

The compensation stage EC is made, in this example, by a single MOS transistor T6 whose source s6 is connected to the drain d2 of the MOS transistor T2 and whose drain d6 is connected to the first terminal of the storage capacitor Cs. The gate g6 of the MOS transistor T6 is connected to its drain d6.

The making of the follower stage ES is based on two MOS transistors T4, T5. The two MOS transistors T4, T5 have a common point B between the source s4 of the MOS transistor T4 and the drain d5 of the MOS transistor T5. The copied voltage Vs', under reduced impedance, is taken between the common point B of the two MOS transistors T4, T5 and the reference.

The gate g4 of the MOS transistor T4 is connected to the first terminal of the storage capacitor Cs. The gate g5 and the source s5 of the MOS transistor T5 are connected and are designed to be biased by a voltage VSS5. The drain d4 of the MOS transistor T4 is designed to be biased by a voltage VDD4.

Figure 7:
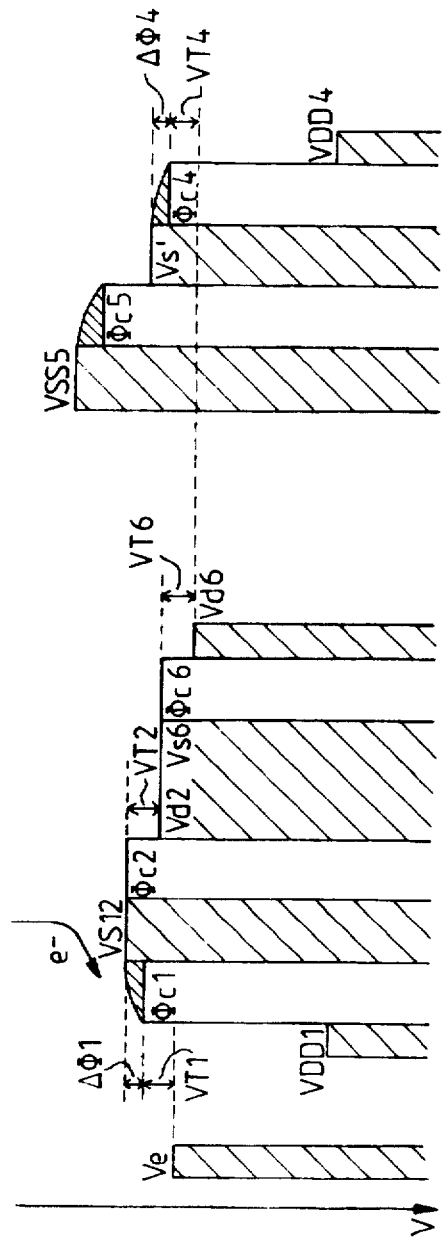
FIG. 7 shows the channel potentials in the substrate for a device in accordance with that of FIG. 6, when the copied voltage is available.

FIG. 7 shows the channel potentials in the substrate into which the device according to the invention is integrated at the final stage when the MOS transistor T2 is off. The voltage Vd6 taken between the first terminal of the storage capacitor Cs and the reference is given by:

$$Vd6=Ve-VT16-\Delta\Phi+VT2+VT6$$

Here again, it can be assumed that the threshold voltages VT1 and VT2 are very close to each other regardless of the voltage Ve, if the two MOS transistors T1, T2 are close to each other and as similar to each other as possible.

The copied voltage Vs' can be written as follows:

ti $Vs'=Vd6-VT4-\Delta\Phi4$ or $Vs'=Ve-\Delta\Phi+VT6-VT4-\Delta\Phi4$

Here too, it can be assumed that the threshold voltages VT6 and VT4 are very close to each other if the MOS transistors T4 and T6 are close to each other and as similar to each other as possible:

$$Vs'=Ve-\Delta\Phi-\Delta\Phi4$$

The voltages $\Delta\Phi1$ and $\Delta\Phi4$ are independent of Ve and may be made small if the MOS transistors T1, T2, T4, T6 have a relatively big ratio W/L. The follower stage ES has introduced a voltage shift VT4 and the compensation stage EC a shift VT6 but these two shifts cancel out.

Figure 8:
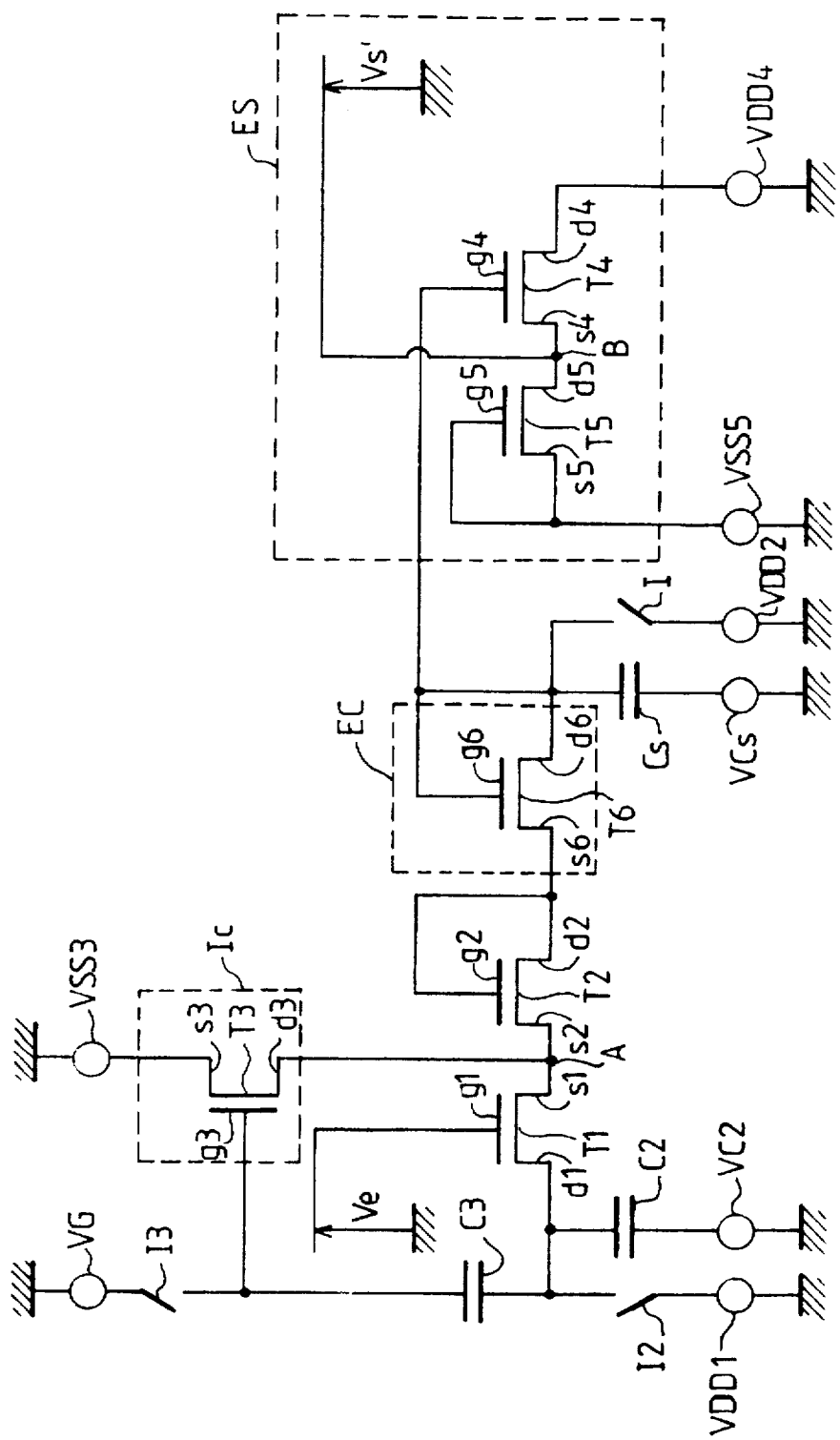
FIG. 8 shows a diagram of a variant of the diagram of FIG. 6 with a reduced copying time.

It may be useful to have available the copied voltage Vs' at low impedance speedily. FIG. 8 illustrates the case of such a device. This device combines the device of FIG. 5 and that of FIG. 6.

It may be judicious to continue to have the copied voltage available when the voltage to be copied has changed its value. For example, in the case of the reading of charges of a column of a photosensitive matrix, it may be useful to have available the copied voltage coming from a first reading operation while the voltage to be copied already comes from a second reading operation.

Figure 9A:
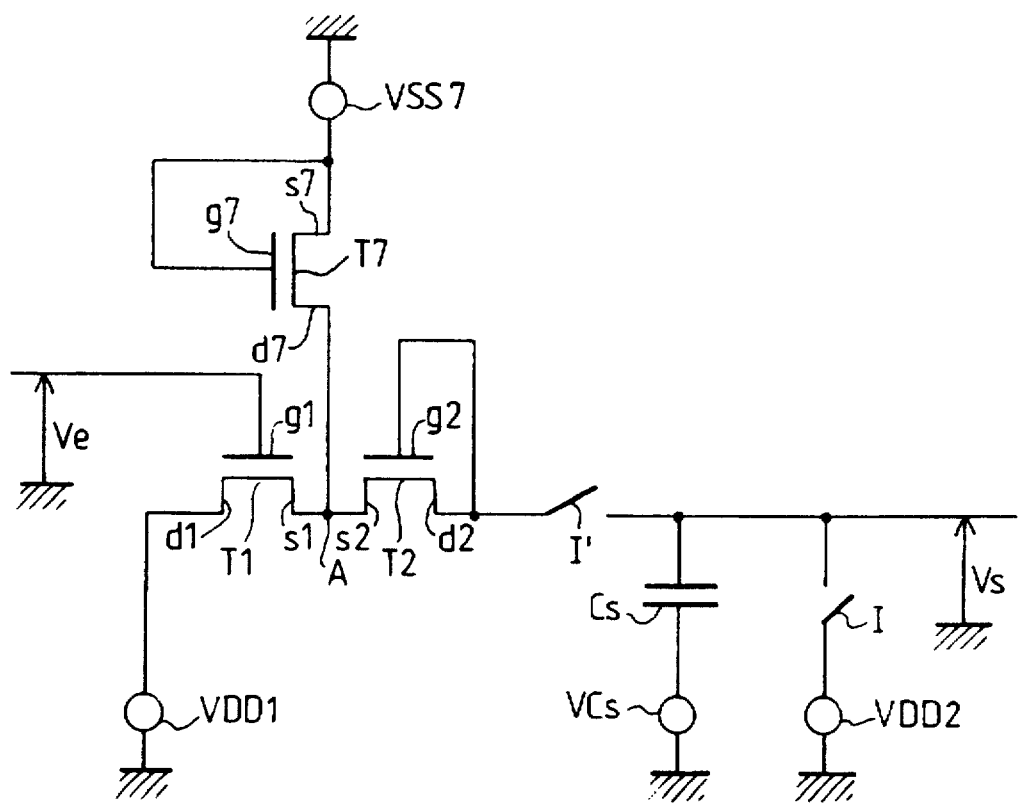
FIGS. 9a and 9b show two diagrams of a device according to the invention enabling the preservation of the copied voltage if the voltage to be copied varies.
Figure 9B:
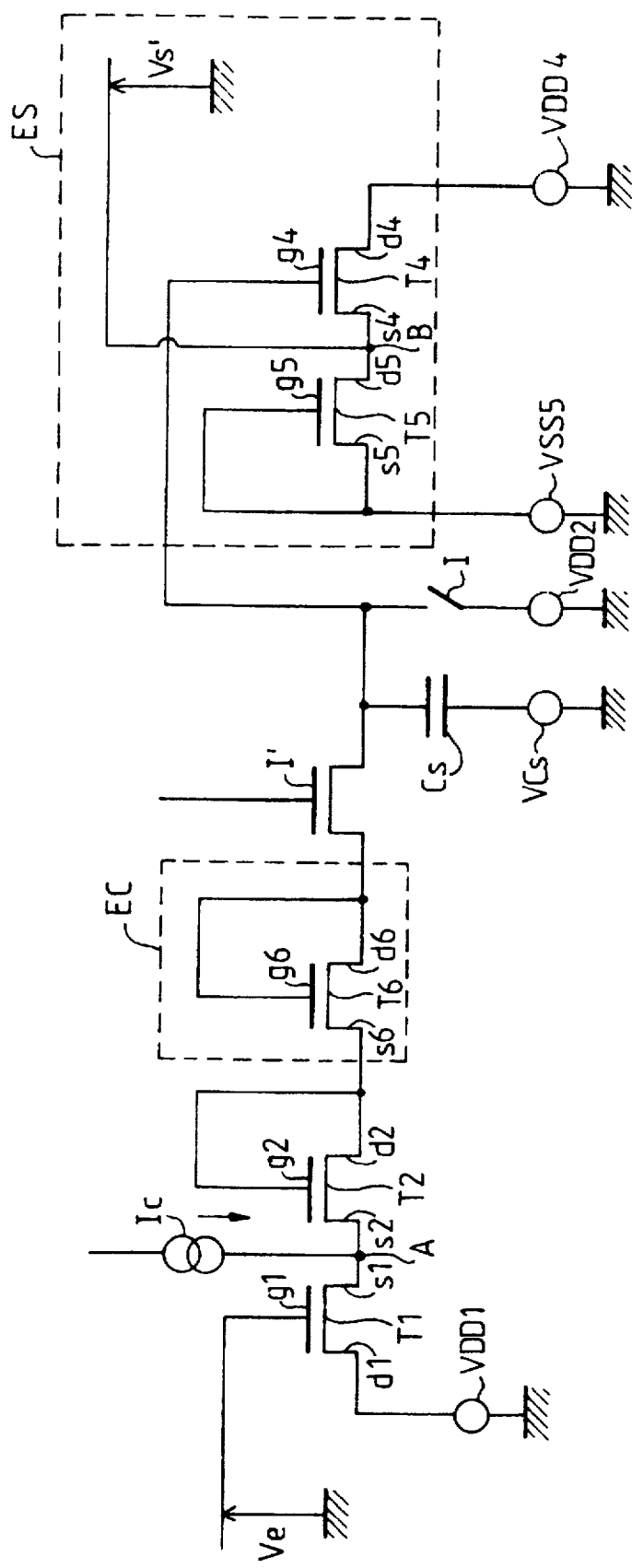

The diagrams of FIGS. 9a and 9b illustrate this variant. The copied voltage is available at high impedance in FIG. 9a and at a low impedance in FIG. 9b.

Means capable of temporarily interrupting the link between the first terminal of the storage capacitor Cs and a pair of MOS transistors T1, T2 are planned. In FIG. 9a, the first terminal of the storage capacitor Cs is connected to the drain d2 of the MOS transistor T2 by means of a switch Γ. When the switch Γ is on, the flux of electrons injected into the common point A may charge the capacitor Cs. As soon as the capacitor Cs is charged and the copied voltage Vs is available, then by turning the switch Γ off, it is possible to continue to have the voltage Vs available without having to undergo the influence of the upline circuit, especially without being influenced by a modification of the voltage Ve to be copied.

In FIG. 9a, the means Ic to inject the flux of electrons into the common point A have a MOS transistor T7 whose drain d7 is connected to the common point A, whose source s7 is designed to be biased by a voltage VSS7 and whose gate g7 is connected to the source s7. This assumes that the threshold voltage of the MOS transistor T7 is negative.

FIG. 9b can be compared with that of FIG. 6 but the switch Γ has been added between the drain d6 of the transistor T6 and the first terminal of the storage capacitor Cs. This switch Γ is shown in the form of a MOS transistor. The switch may be actuated by controlling the voltage applied to its gate.

Other modes of layout could have been possible for the switch Γ, for example, between the drain d2 of the MOS transistor T2 of the pair and the source of the MOS transistor T6.

The means capable of temporarily interrupting the link between the first terminal of the storage capacitor Cs and the pair of MOS transistors T1, T2 may be introduced in variants leading to a reduction of the copying time.

All the MOS transistors shown and described here above are N type transistors but those skilled in the art could easily transpose the description to apply it to P type MOS transistors.

What is claimed is:

1. A device for copying a voltage (Ve) comprising a pair of series-connected MOS transistors, the voltage (Ve) to be copied being applied between the gate of a first one of said pair of series-connected MOS transistors and a reference, said device comprising:

means to inject a flux of electrons at a point common to the sources of the pair of transistors, a storage capacitor having a first terminal connected to the drain of the second one of said pair of MOS transistors and having a second terminal connected to a first potential, means to provide a second potential at the drain of the second MOS transistor of the pair and vary said second potential so that the flux of electrons is stored in the storage capacitor while at the same time decreasing in the second MOS transistor to the benefit of the first transistor, a copied voltage (Vs) being available, after stabilization, between the first terminal and the reference, wherein said drain of said second transistor is connected to the gate of said second transistor and said drain of said first transistor is connected to a bais potential circuit.

2. A voltage copying device according to claim 1, wherein the means for injecting the flux of electrons at the common point comprise a MOS transistor whose drain is connected to the common point and whose gate and source, connected together, are biased.

3. A voltage copying device according to either of the claims 1 or 2, wherein the means for providing the potential comprise a switch, one end of which is connected to the first terminal of the storage capacitance while the other end is connected to said second potential.

4. A voltage copying device according to claims 1, wherein said bias circuit is connected to said means to inject and comprises and means to regulate the injection of electrons as a function of the flux of electrons flowing in the first MOS transistor so as to accelerate the copying operation.

5. A voltage copying device according to claim 4, wherein the means to regulate comprises:

means to impose a potential Vd1 on the drain of the first MOS transistor and to vary said potential Vd1 so that the electrons flowing in the first MOS transistor are stored at a second storage capacitor, a first terminal of which is connected to the drain of the first MOS transistor and a second terminal is connected to a third potential and, means to initialize the injection of electrons and then to diminish the injection of electrons as a function of the variation of the potential VD1 of the drain of the first MOS transistor.

6. A voltage copying device according to claim 5, wherein the means to impose the potential Vd1 comprise a first switch having one end connected to the drain of the first MOS transistor and another end connected to a bias voltage Vd1 dictating the potential Vd1.

7. A voltage copying device according to one of the claims 5 or 6 wherein, when the means for injecting the electron flux comprise a MOS transistor, wherein the means to initialize comprise:

a bias switch having a first end connected to the gate of the MOS transistor and a second end connected to a bias voltage seeking to initialize the injection of electrons when the bias switch is on;

and a third capacitor mounted between the gate of the MOS transistor and the drain of the first MOS transistor of the pair, this third capacitor transmitting the variation of the potential Vd1 of the drain of the first MOS transistor to the gate of the MOS transistor when the bias switch is off.

8. A voltage copying device according to claim 5, wherein the means to provide a potential, the first means to impose and the means to initialize are de-activated in a synchronized manner.

9. A voltage copying device according to claim 5, wherein said means to impose and said means to initialize are simultaneously operating during a predetermined period.

10. A voltage copying device according to claim 9, wherein the means to provide a potential, one of said means to impose and said means to initialize are de-activated in a synchronized manner.

11. A voltage copying device according to claim 4, comprising a buffer capacitor having a first terminal connected to the common point and a second terminal connected to a fourth potential, this buffer capacitor further accelerating the copying operation.

12. A voltage copying device according to claim 1, comprising processing means to process the copied voltage (Vs') so as to reduce its impedance.

13. A voltage copying device according to claim 12, wherein the processing means comprise a follower stage connected to the first terminal of the storage capacitor giving the copied voltage (Vs') at low impedance and a compensation stage to compensate for a voltage difference introduced by the follower stage, connected between the first terminal of the storage capacitor (Cs) and the pair of MOS transistors.

14. A voltage copying device according to claim 13, wherein the follower stage comprises two additional MOS transistors having a common point between the source of the first additional MOS transistor and the drain of the second additional MOS transistor, the gate of the first additional MOS transistor being connected to the first terminal of the storage capacitor, the source of the second additional MOS transistor connected to its gate being designed to be biased, the copied voltage (Vs') being tapped between the common point and the reference.

15. A voltage copying device according to claim 13, wherein the compensation stage comprises a MOS transistor whose source is connected to the drain of the second MOS transistor of the pair, and whose gate and drain are connected to the first terminal of the storage capacitor.

16. A voltage copying device according to claim 1, comprising means for retaining the copied voltage Vs at the same value in the presence of a variation of the value of the voltage Ve to be copied.

17. A voltage copying device according to claim 15, wherein the compensation stage comprise a switch to temporarily cut the link between the first terminal of the storage capacitor and the pair of MOS transistors when the copied voltage Vs is available.

18. A voltage copying circuit according to claim 5, wherein at least one of the switches is formed by a MOS transistor.

19. A voltage copying circuit according to claim 1, wherein the MOS transistors of the pair are substantially identical.

20. A voltage copying circuit according to claim 15, wherein the MOS transistor of the compensation stage and the first MOS transistor of the follower stage are substantially identical.

* * * * *